(12) United States Patent
Schmid et al.

(10) Patent No.: US 11,700,161 B2
(45) Date of Patent: Jul. 11, 2023

(54) MULTIPLEX OF HIGH DEFINITION RADIO STATIONS

(71) Applicant: Nautel Limited, Hackett's Cove (CA)

(72) Inventors: Philipp Schmid, Hackett's Cove (CA); Brian Walker, Bedford (CA)

(73) Assignee: NAUTEL LIMITED, Nova Scotia (CA)

( * ) Notice: Subject to any disclaimer, the term of this patent is extended or adjusted under 35 U.S.C. 154(b) by 0 days.

(21) Appl. No.: 16/582,892

(22) Filed: Sep. 25, 2019

(65) Prior Publication Data

US 2020/0035892 A1   Jan. 30, 2020

Related U.S. Application Data

(63) Continuation of application No. 15/565,329, filed as application No. PCT/CA2016/050406 on Apr. 8, 2016, now Pat. No. 10,469,301.

(30) Foreign Application Priority Data

Apr. 10, 2015   (CA) .................................. CA 2887751

(51) Int. Cl.
*H04L 27/26*   (2006.01)
*H01L 33/00*   (2010.01)
(Continued)

(52) U.S. Cl.
CPC ........ *H04L 27/2621* (2013.01); *H01L 33/005* (2013.01); *H01L 33/486* (2013.01);
(Continued)

(58) Field of Classification Search
CPC .............. H04H 20/00; H04H 2201/12; H04H 2201/183; H04L 27/2623; H04L 27/2624; H04L 27/2621; H04L 27/2647
(Continued)

(56) References Cited

U.S. PATENT DOCUMENTS 6,128,350 A   10/2000   Shastri et al.
8,369,431 B2   2/2013   Walker et al.
(Continued)

FOREIGN PATENT DOCUMENTS

| EP | 1802065 A1 | 6/2007 |
|----|------------|--------|
| WO | 9406231 A1 | 3/1994 |
| WO | 2001015402 A1 | 3/2001 |

OTHER PUBLICATIONS

International Search Report for International Patent Application No. PCT/CA2016/050406 (Form PCT/ISA/210), dated May 10, 2016 (4 pages).

(Continued)

*Primary Examiner* — Leila Malek
(74) *Attorney, Agent, or Firm* — Withrow & Terranova, P.L.L.C.; Vincent K. Gustafson (57) ABSTRACT

A system for peak-to-average-power ratio (PAPR) reduction of a frequency shifted plurality of digital broadcast signals taking into account the combined signal peaks in order to transmit the signals more efficiently in a single broadcast transmission system. The PAPR algorithm takes into account a rotating constellation phase offset for the shifted signals corresponding to the amount of applied frequency shift. In the case of a dual sideband In-Band-On-Channel (IBOC) signal typically used in conjunction with an FM carrier in the center, the sidebands can be interleaved to create a new IBOC signal definition and take the place of the FM carrier for an all-digital transmission that is backward compatible with IBOC receivers allowing for a gradual migration to all digital broadcasting.

6 Claims, 13 Drawing Sheets

(51) Int. Cl.
  *H01L 33/48* (2010.01)
  *H01L 33/60* (2010.01)
  *H01L 33/62* (2010.01)
  *H01L 33/64* (2010.01)
  *H04H 20/00* (2009.01)

(52) U.S. Cl.
  CPC .............. *H01L 33/60* (2013.01); *H01L 33/62* (2013.01); *H01L 33/642* (2013.01); *H04H 20/00* (2013.01); *H04L 27/2623* (2013.01); *H04H 2201/12* (2013.01); *H04H 2201/183* (2013.01); *H04L 27/2624* (2013.01)

(58) Field of Classification Search
  USPC ......................................................... 375/295
  See application file for complete search history.

(56) References Cited

U.S. PATENT DOCUMENTS

| | | | | |
|---|---|---|---|---|
| 2001/0050926 | A1* | 12/2001 | Kumar | H04L 1/08 370/529 |
| 2004/0062392 | A1 | 4/2004 | Morton | |
| 2004/0141548 | A1* | 7/2004 | Shattil | H04L 27/0004 375/146 |
| 2009/0257516 | A1* | 10/2009 | Hsieh | H04L 5/0051 375/260 |
| 2012/0115421 | A1* | 5/2012 | Wu | H04H 20/62 455/62 |
| 2012/0189070 | A1* | 7/2012 | Kroeger | H04L 27/2623 375/260 |
| 2013/0266082 | A1 | 10/2013 | McGowan et al. | |
| 2014/0153625 | A1 | 6/2014 | Vojcic et al. | |
| 2015/0156266 | A1 | 6/2015 | Gupta | |
| 2017/0163465 | A1 | 6/2017 | Piazza et al. | |
| 2018/0123853 | A1 | 5/2018 | Schmid et al. | |

OTHER PUBLICATIONS

Written Opinion for International Patent Application No. PCT/CA2016/050406 (Form PCT/ISA/237), dated May 10, 2015 (6 pages).

Phillipp Schmid, "HD Multiplex—All Digital IBOC Today," Nautel Limited, Apr. 12, 2015 (14 pages). Retrieved from the Internet <URL:http://www.nautel.com/wp-content/uploads/2015/04/HD-Multiplex-NUG-2015.pdf>.

Zixia Hu, et al., "System Design and Implementation of Broadband In-Band On-Channel Digital Radio," 2012 IEEE International Conference on Communications (ICC), Jun. 15, 2012, pp. 4776-4781.

Schmid, Philipp, "Interleaving IBOC Signals for a Digital HD Radio Multiplex," www.nautel.com/content/user_files/2016/04/Interleaving-IBOC-signals-for-digital-hd-radio-multiplex-philipp-schmid-2015.pdf, Jul. 31, 2015, 14 pages.

Extended European Search Report for European Patent Application No. 16775985.1, dated Oct. 29, 2018, 8 pages.

Office Action for U.S. Appl. No. 15/565,329, dated Oct. 3, 2018, 15 pages.

Notice of Allowance and Applicant-Initiated Interview Summary for U.S. Appl. No. 15/565,329, dated Jun. 25, 2019, 11 pages.

Extended European Search Report for European Patent Application No. 21157170.8, dated May 27, 2021, 8 pages.

* cited by examiner

MULTIPLEX OF HIGH DEFINITION RADIO STATIONS

CROSS-REFERENCE TO RELATED APPLICATIONS

This application is a continuation of U.S. patent application Ser. No. 15/565,329 filed on Oct. 9, 2017 and subsequently issued as U.S. Pat. No. 10,469,301 on Nov. 5, 2019, which is a 35 U.S.C. § 371 national phase filing of International Application No. PCT/CA2016/050406 filed on Apr. 8, 2016, and claims the benefit of Canadian Patent Application No. 2,887,751 filed on Apr. 10, 2015, wherein the entire disclosures of the foregoing applications and patent are hereby incorporated herein by reference herein.

TECHNICAL FIELD

The current disclosure relates to the transmission of OFDM signals and, in particular, to multiplexing multiple stations together.

BACKGROUND

Radio broadcasts have transitioned from an all-analog signal to a hybrid signal combining both digital and analog signals. The digital signals may provide better efficiency, for example, allowing more audio streams to be broadcast in the same bandwidth.

It would be desirable to be able to provide a system capable of transmitting an all-digital signal that is compatible with at least a portion of current receivers.

SUMMARY

In accordance with the present disclosure there is provided a digital broadcast system comprising: an input component for receiving a plurality of stations and frequency-shifting the stations to provide a multiplex of the plurality of stations; a power reduction component for peak reducing the multiplex and providing a corresponding output signal; and a transmitter component for transmitting the output signal.

In a further embodiment of the system, the peak reduction is based on an iterative clipping and correction algorithm that controls the in-band and out-of-band noise from peak reduction.

In a further embodiment of the system, the correction algorithm operates on the signal in the frequency domain.

In a further embodiment of the system, the power reduction component undoes a phase shift prior to frequency domain corrections and re-applies the phase shift following the frequency domain corrections.

In a further embodiment of the system, two or more of the plurality of stations comprise IBOC stations.

In a further embodiment of the system, two or more of the plurality of stations in the multiplex are interleaved in frequency In a further embodiment of the system, two or more of the plurality of stations comprise DRM+ stations.

In a further embodiment of the system, two or more of the plurality of stations comprise China Digital Radio stations.

In a further embodiment of the system, two or more of the plurality of stations in the multiplex are interleaved in frequency.

In a further embodiment of the system, service modes and sideband levels of the IBOC stations are independently configurable.

In a further embodiment of the system, each of the plurality of stations in the multiplex is independently adjustable in power.

In a further embodiment of the system, the plurality of stations are produced by multiple independent modulators.

In a further embodiment of the system, each of the respective modulators have synchronized symbol timing.

In a further embodiment of the system, each of the respective modulators produce OFDM with perfect frequency and standard subcarrier spacing.

In a further embodiment of the system, the frequency shift applied to each station is an integral of the subcarrier spacing.

In a further embodiment of the system, one or more of the plurality of stations use a single frequency network implementation.

In a further embodiment of the system, the output signal includes one or more FM carriers.

In a further embodiment of the system, the one or more FM carriers allow a receiver to scan for one or more of the plurality of stations.

In a further embodiment of the system, the FM carrier is modulated to provide a signal instructing a listener to tune in via a digital radio.

In a further embodiment, the system further comprises a second input component for receiving a second plurality of stations and frequency-shifting the stations to provide a second multiplex of the plurality of stations that has synchronized symbol timing with the multiplex; and a second power reduction component for peak reducing the second multiplex and providing a corresponding second output signal.

In a further embodiment, the system further comprises a signal combiner for combining the output signal with the second output signal for transmission by the transmitter.

In a further embodiment, the system further comprises a second transmitter component for transmitting the second output signal.

In accordance with the present disclosure there is further provided a digital radio receiver capable of receiving a transmitted digital multiplex comprising a plurality of frequency shifted stations having time-aligned symbols and decoding data on one or more of the plurality of frequency shifted stations.

In a further embodiment of the digital radio receiver, a single receiver stack is used in decoding the data.

In a further embodiment of the digital radio receiver, the receiver stack comprises one or more of: a symbol tracking loop; a channel estimator; and a data decoder that undoes a phase shift of symbols due to the station frequency shift.

In a further embodiment of the digital radio receiver, the receiver is at least one of: an HD Radio receiver; a DRM receiver; and a China Digital Radio receiver.

DETAILED DESCRIPTION

Figure 1:
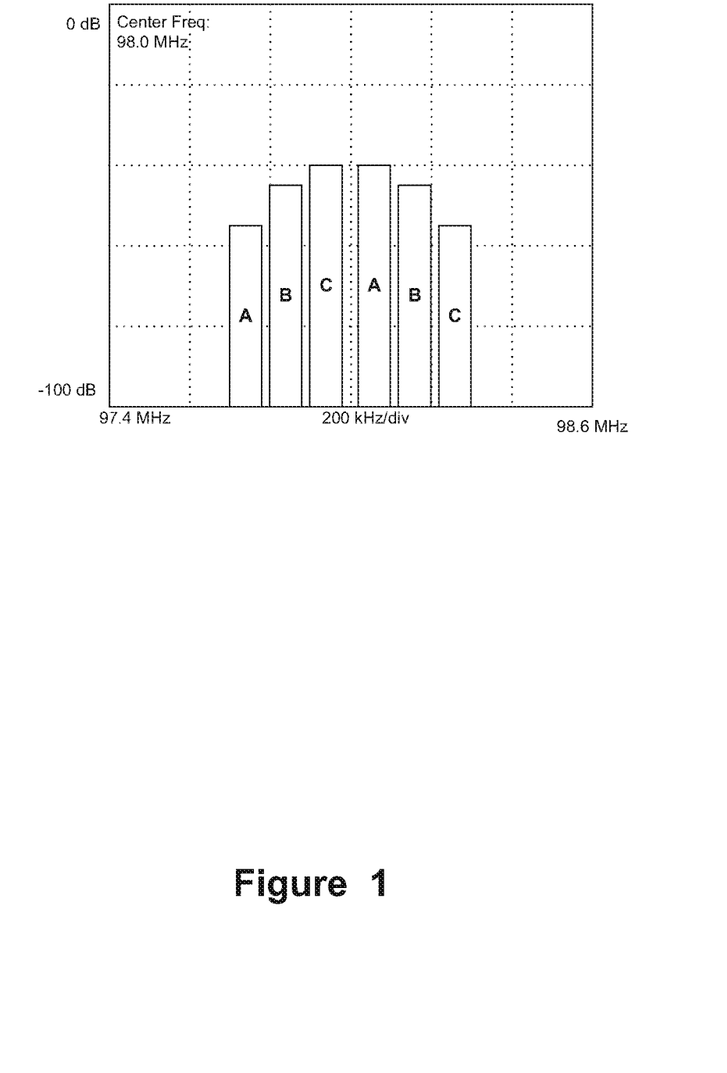
FIG. 1 shows a three station multiplex.

The HD Multiplex concept is an extension of the IBOC system. The output of multiple independent IBOC exgine modulators can be combined in a single crest factor reduction engine, such as that described in U.S. Pat. No. 6,128,350 of Shastri et al. and U.S. Pat. No. 8,369,431 of Walker et al. (referred to as HD PowerBoost further herein) the contents of which are incorporated herein by reference in their entirety. This allows a single multiplex of 2 or more IBOC stations to be amplified using a single transmitter and subsequent antenna system by replacing the FM signal used in hybrid IBOC transmission. This results in an all-digital IBOC configuration capable of carrying up to 3 times the standard IBOC payload. Such a multiplex can carry up to 15 audio streams in 600 kHz of signal bandwidth. Such channel multiplexing can be extended by adding further sidebands in various permutations. FIG. 1 shows a three station multiplex with the three separate stations marked as A, B and C. The corresponding IBOC sidebands are all spaced the standard 200 kHz apart and therefore maintain backward compatibility with existing receivers.

Figure 6:
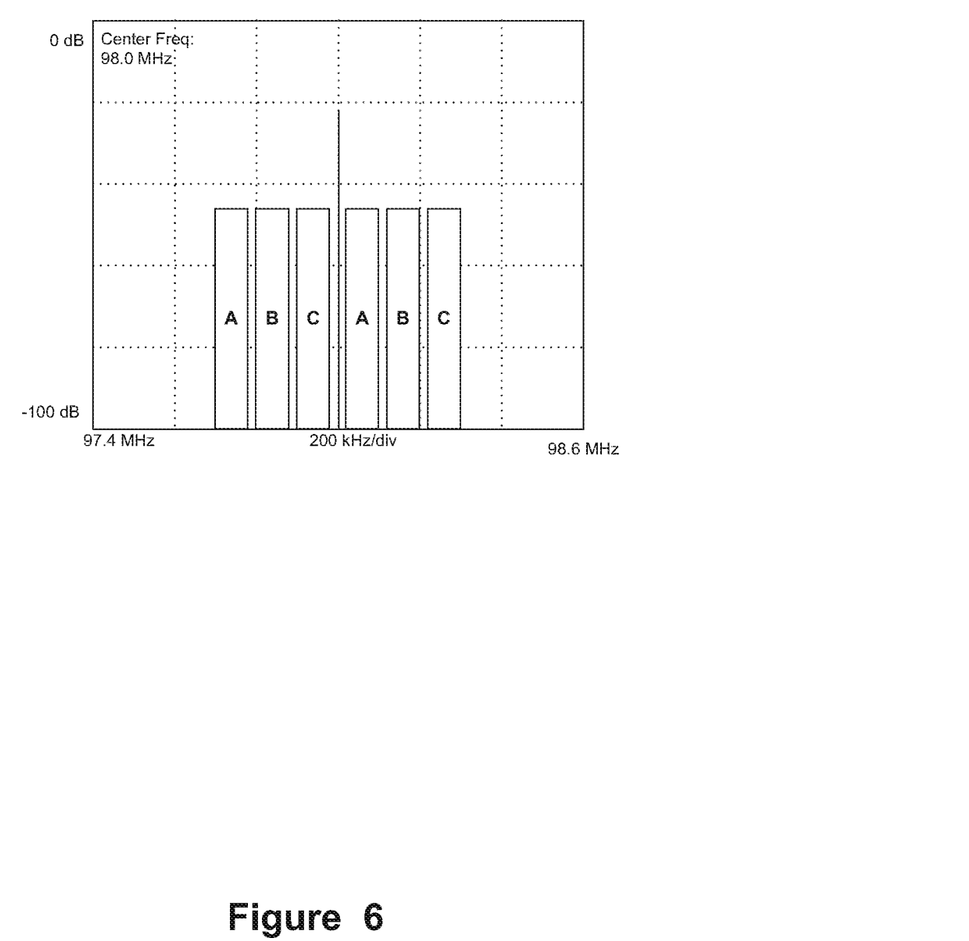
FIG. 6 depicts an unmodulated FM Carrier.

The described system provides an effective migration path from today's hybrid HD radio implementation, that places two IBOC sidebands, one on each side of the traditional FM carrier, to an all-digital IBOC signal. This is backward compatible with a large cross section of the existing receiver base and can coexist with standard FM stations. As described further herein, a single broadcast transmitter and transmission system can be used to fill in the spectrum presently allocated to the FM carrier with IBOC carriers from 2 or more independently modulated IBOC signals. Modification to the established IBOC crest factor reduction outlined by Shastri et al., which is also the basis of HD PowerBoost, allows the crest factor reduction to operate on all of the independent stations producing a signal with comparable peak to average power ratio (PAPR) to a present day IBOC only transmitter. The number of added IBOC signals at the same power level can scale with transmitter size allowing a larger, more efficient, transmitter model to be used for all signals. Since a single IBOC signal only requires about 10% signal power to achieve FM comparable coverage, a three station multiplex as shown in FIG. 6 requires less than 30% of the power of a comparable FM carrier.

One example configuration uses 600 kHz of bandwidth that interleaves 3 stations, identified as A, B and C, is shown in FIG. 1. Using the established service mode MP3, the effective IBOC bandwidth of 123.2 kBps can be tripled to 369.6 kbps. Using a combination of 32 kbps, 24 kbps and 14 kbps audio streams, up to 15 audio streams can be placed on this multiplex. It is conceivable that up to 240 audio streams could be placed in the FM band for a given market assuming a 50% band frequency use once the entire band is converted to all digital operation. Note that IBOC frequency reuse is superior to FM, which requires at least a 25-30 dB signal differential. IBOC only requires a 4-6 dB signal differential, allowing for closely spaced IBOC stations and making better use of the FM band. This demonstrates the spectral efficiency of the all-digital IBOC signal standard.

The all-digital IBOC modes proposed by iBiquity (MS1-4) so far are not implemented in broadcast transmitters or receivers. The current system is backward compatible since it is built upon existing modulator and receiver technology widely deployed today. Multiple exgine IBOC modulators (latest $4_{th}$ generation) and other IBOC transmission components can be executed on one or more exciter hardware platforms provided on one or more CPUs, DSPs, and/or FPGAs. All presently implemented IBOC service modes may be used with the current multiplexing system and not all stations in the multiplex need to have the same service mode. Future service modes, such as single sideband modes are also expected to be applicable.

Potential application areas for the multiplexing system include:
  HD conversion by leasing an audio stream on the multiplex
    Channel operation can be financed via ad insertion not possible using today's simulcast
    Moving AM stations to the FM band as proposed by some countries such as Mexico
    Netcasters with a large number of audio streams can place the most popular streams on air
    LPFM operators may opt to use a side channel on an HD multiplex rather than their own signal Placing multiple IBOC stations onto a single transmission system makes better use of the IBOC transmitter as the transmission power cost decreases per Watt with the size of the broadcast transmitter. Furthermore, using a single antenna system to broadcast the multiplex helps the receiver separate each individual IBOC station as the "first adjacent" desired/undesired (D/U) ratio is fixed.

Figure 12:
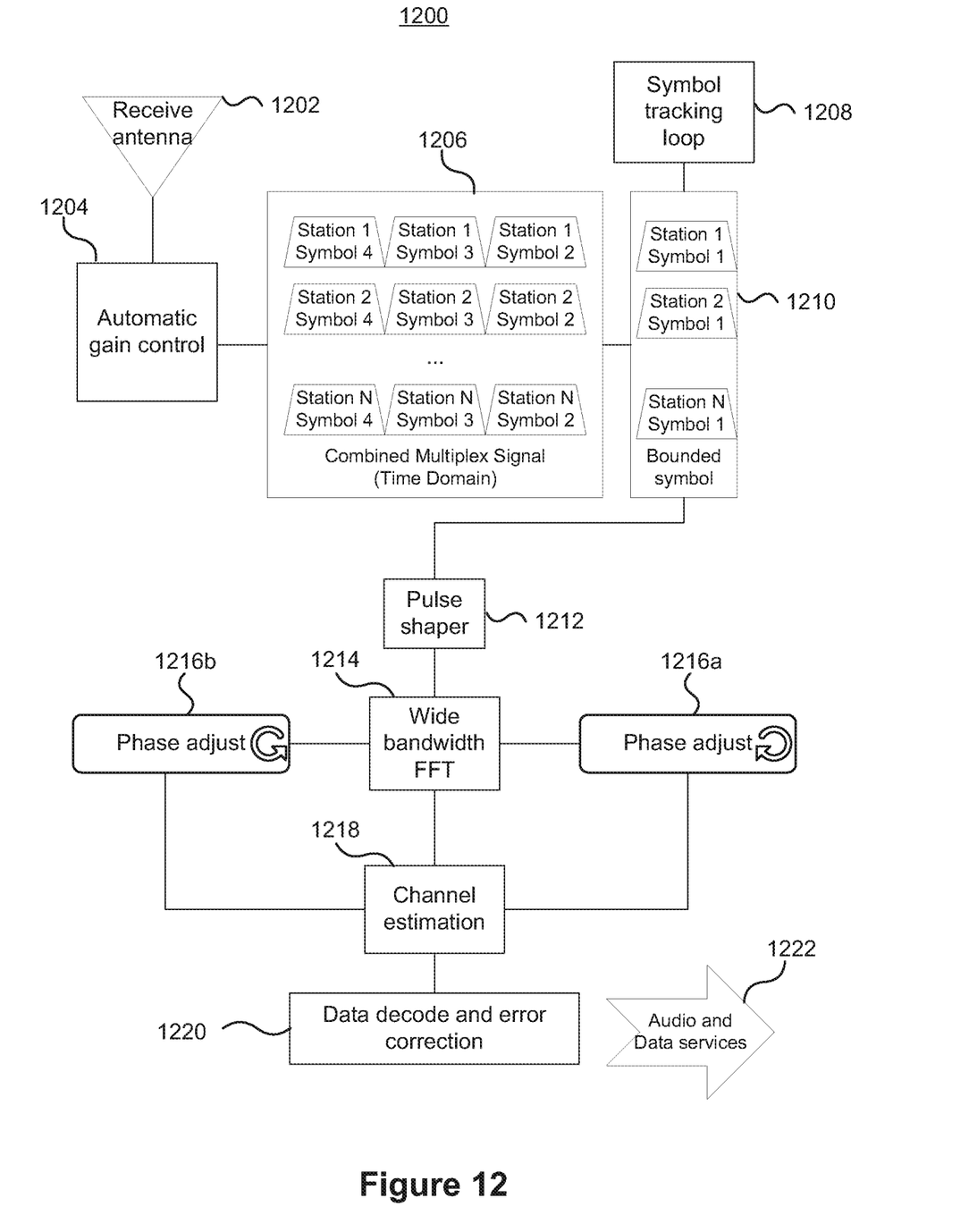
FIG. 12 depicts a multiplex receiver implementation.

It is conceivable to design a 600 kHz, or more, receiver that is able to decode the entire multiplex at once using 2 or 3 standard IBOC signal demodulators and extract all the audio and data services at once. Since all signals in a multiplex exhibit synchronized symbol timing only a single symbol tracking loop is required provided the receiver is informed all signals are part of the same multiplex. The tracking loop can either look at a one or more stations and extend the symbol timing across the other stations or the tracking loop can look at the combination of all stations and derive the symbol timing. A single channel estimator and sub-carrier demodulator can be used across the wider bandwidth to extract all the audio and data services at once. When looking at the constellation in the frequency domain, the receiver must correct for the phase offset in the same method as described in this document for iterative peak reduction. This is obviously distinct from independent receivers performing this operation tuned to their own respective stations and later bonding the data. Using a single wider bandwidth receiver embodiment promises significant hardware resource savings. A receiver implementing the above technique is depicted in FIG. 12. With an audio offering of up to 15 audio streams to choose from, a smart receiver could build a customized audio playlist based on listener preferences. An electronic program guide, channel list and alternate frequency/stream system may be used to inform a listener of available audio streams. Combined with improved HD scan capability the listener may be able to easily discover new audio and data offerings. The dynamics of having a large number of audio streams under the control of a single broadcast entity as provided by the current system may justify developing and deploying electronic program guides to receivers and listeners.

Figure 2:
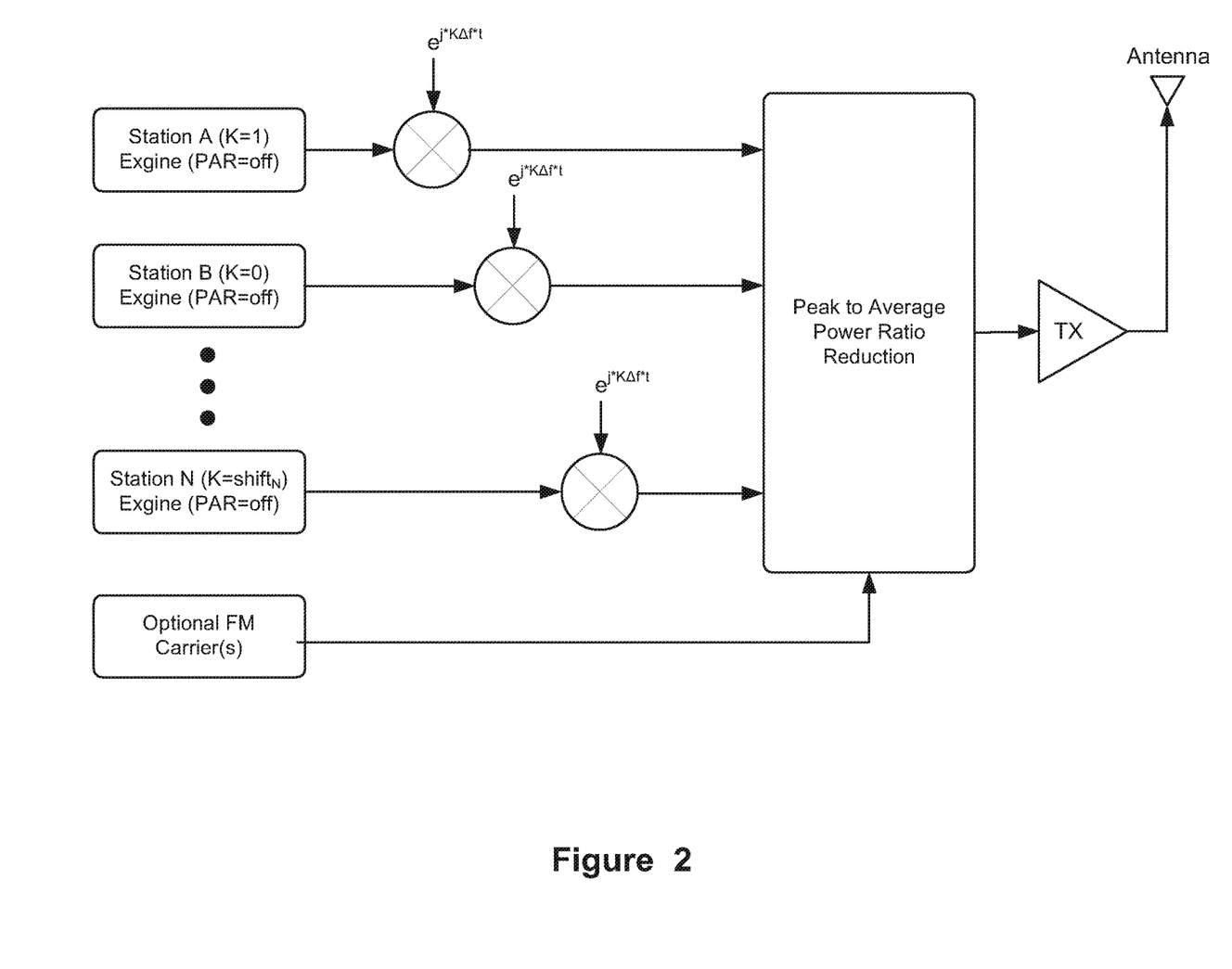
FIG. 2 shows a block diagram of a multiplexing system useful for transmitting a plurality of stations and implementing a peak to average power ratio (PAPR) reduction process.
Figure 3:
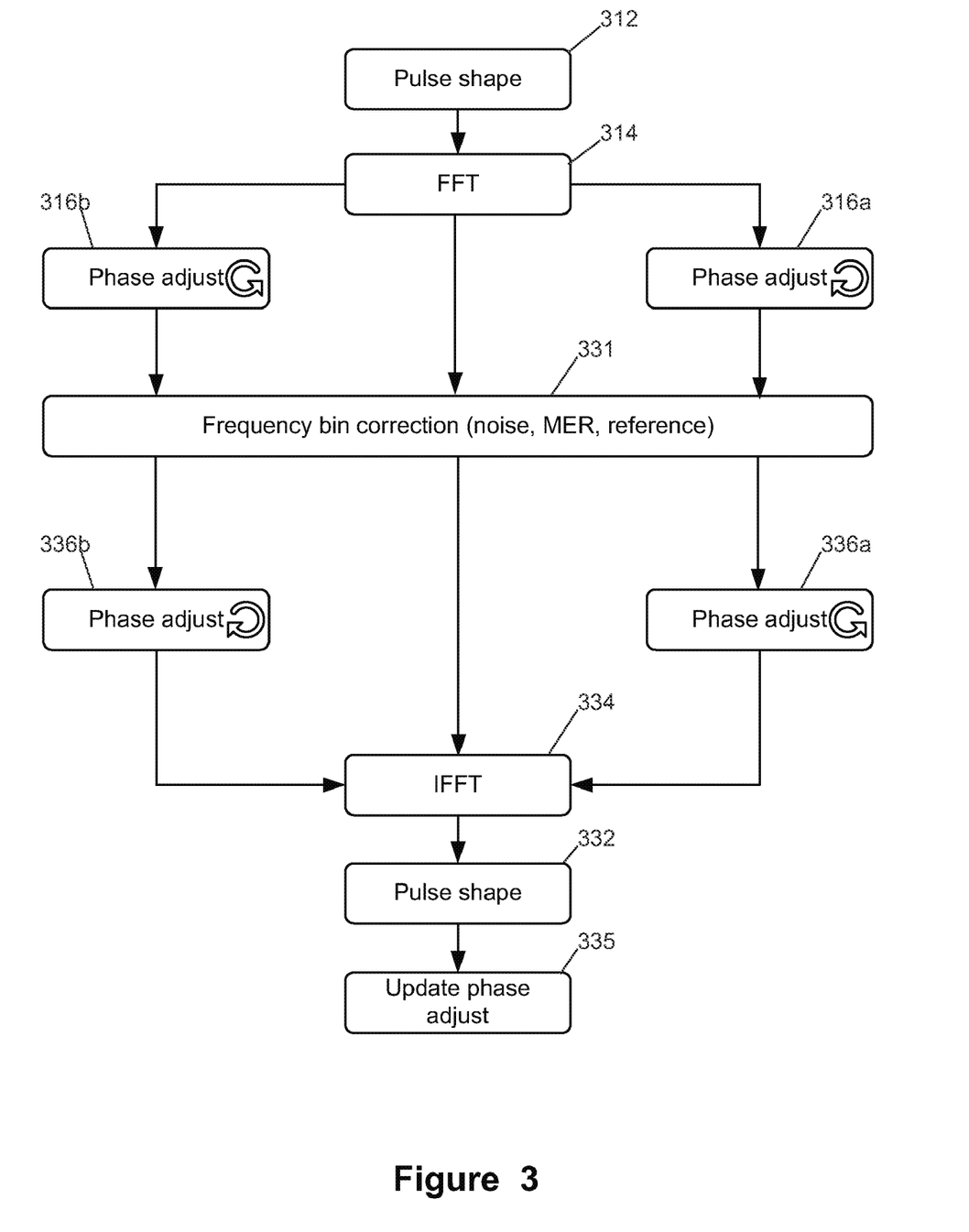
FIG. 3 depicts a PAPR reduction process used in the system of FIG. 2.

FIG. 2 shows a block diagram of a multiplexing system useful for transmitting a plurality of stations and implementing a peak to average power ratio (PAPR) reduction process. FIG. 3 is a block diagram depicting the PAPR reduction process used in the system of FIG. 2. Block 312 shows pulse shape removal from signals in the multiplex of stations. Block 314 shows wideband Fast Fourier Transform (FFT) conversion of the stations to frequency domain. Blocks 316a, 316b show phase adjustment of station signals. In combination, blocks 312, 314, 316a, 316b represent a demodulation portion of the PAPR reduction process. As shown in block 331, signal correction in the frequency domain may include correction of noise frequency bins as well as improving the modulation error ratio (MER) of data and reference carriers. Blocks 336a, 336b, 334, 332 represent a modulation part of the PAPR reduction process. Blocks 336a, 336b provide phase adjustment to restore the original phase angle. Block 334 shows wideband iFFT modulation back into the time domain. Block 33s shows addition of the original pulse shape, and block 335 shows updating of phase adjustment when moving on to a new symbol.

FIG. 12 depicts a multiplex receiver implementation operating on a multiplex of multiple stations broadcast from a transmitting system according to FIGS. 2 and 3 and may embody demodulation components according to the PAPR reduction system in FIG. 3. The receiver system 1200 receives a radio frequency signal, comprising a plurality of different station signals, at a receiver antenna 1202. The received signal may be processed by an automatic gain control 1204 in order to provide a signal at appropriate levels for further processing. The signal comprises a combined multiplex signal 1206, which contains a plurality of different station signals as produced and modulated by a broadcast transmitter. As depicted, symbols of each of the stations in the multiplex signal 1206 are time aligned, and as such a single symbol tracking loop 1208 is able to process the multiplex signal to provide the symbols 1210 for all of the stations. The bounded symbols may be processed by a pulse shaper 1212 (e.g., with functionality corresponding to block 312 in FIG. 3) in order to condition the signal. A wide bandwidth FFT 1214 (e.g., with functionality corresponding to block 314 in FIG. 3) is applied and the phase adjusted 1216a, 1216b (e.g., with functionality corresponding to blocks 316a, 316b in FIG. 3) as required. The phase corrected signal is then used for channel estimation 1218 and the data decoded and error corrected 1220 for each of the stations present in the multiplex. The audio and data services 1222 carried by each station of the received multiplex are output from the receiver.

It is possible to input multiple independent stations into a single crest factor reduction engine, such as that described in HD PowerBoost, in order to peak reduce the entire multiplex. It is possible to simply frequency shift individual IBOC signals, combine them digitally or in analog and use common amplification. Consider, however, that each IBOC signal has a PAPR of at least 6 dB. Adding N stations together increases the PAPR according to the following formula:

$$PAPR_{total}(dB)=10 \log(N \cdot PAPR_{single}(\text{linear}))=PAPR_{single}(dB)+10 \log N$$

In the example of 3 stations being added together, the resulting PAPR would be given by:

$$PAPR_{3\ stations}(dB)=PAPR_{single}(dB)+10 \log 3=6\ dB+4.77\ dB=10.77\ dB$$

By combining the signals into a single PAPR reduction engine, an overall PAPR comparable to that of a single station can be obtained; effectively the signal energy spreads across the participating stations in the multiplex.

FIG. 2 shows a block diagram of N standard iBiquity supplied exgine modulators feeding a single peak-to-average-power reduction engine. The frequency shift shown in the diagram is conceptual and can also be performed as a bin reassignment in the frequency domain. In this case, each IBOC symbol is first demodulated by removing the pulse shaping function and then transformed into the frequency domain using an FFT. Note that a true 100 kHz shift cannot occur as bins must be shifted an integral number of sub carrier spacings of 363.4 Hz in order to preserve the IBOC constellation across the multiplex. The closest shift is 275 frequency bins either way for 100 kHz. This translates into an effective shift frequency of 99.928 kHz. At 87.7 MHz a frequency error of 72 Hz translates into an error of 0.82 ppm. This is within the tolerance of the IBOC signal specification of 1 ppm. It does mean that the main transmitter frequency accuracy should be better than 0.2 ppm likely requiring GPS synchronization of the transmitter.

The following calculations are shown for the IBOC modulator sample rate of 744187.5 Hz. The same calculations can be performed at oversampled rates. An integer multiple may be used in order to extend the multiplex with more carriers.

The effect of applying a continuous frequency shift on a cyclic OFDM for the off frequency stations has the effect of a symbol-to-symbol rotating phase offset. This is due to the fact that the continuous frequency shift keeps rolling past the 2048 IBOC samples over the added 112 guard interval samples. If the signal is to be presented as independent IBOC sidebands to the receiver, this effect must be maintained—this is different than simply having more OFDM carriers. Failing to do so, a receiver may incorrectly interpret this effect as a gradual delay slip due to a sampling frequency offset. If the receiver takes action on this arbitrary error, the correction can introduce noise and bit errors leading to a loss in signal quality.

For the 275 bin frequency shift described above, this means that the continuous complex frequency of 275/2048*744187.5 Hz=99,928 Hz keeps running for the 112 samples of the guard interval at 744187.5 Hz. This adds a fixed phase offset at the start of the next symbol of 94.5 radians. The modulus of 2*pi may be taken, which leaves a symbol-to-symbol phase correction of 0.2454 radians as expressed by:

$$\text{phase correct}=(112*\text{bins}/2048*2\pi) \bmod (2\pi);$$
$$\text{bins}=275@100\ \text{kHz}$$

Preserving this aspect means that the PAPR reduction engine does not have fixed constellations to work with for the off frequency stations. This prevents the algorithm from performing the frequency domain correction steps outlined in the HD PowerBoost description, including correcting the noise in the unused frequency bins, limiting the MER in the data carriers and correcting the phase of the reference carriers.

Modifying the PAPR reduction algorithm is shown in FIG. 3. The PAPR reduction depicted in FIG. 3 may, for example, replace block 192 in FIG. 2 of HD PowerBoost. It utilizes a running phase accumulator for every shifted individual station that gets updated after every symbol by the offset computed above. The accumulator is subtracted for a negative shift and added for a positive shift. Alternatively, the phase shift can be multiplied into the frequency bin using $e^{j\ phase\ acc}$ and this scalar can be updated by multiplying the phase correction value into the running accumulator as shown here:

$$e^{j\ phase\ acc}=e^{j\ phase\ acc}*e^{j\ phase\ correct}$$

To undo the phase shift prior to the frequency domain corrections as described in HD PowerBoost (noise bins, data carrier and reference carrier MER), the phase angle of the running accumulator is simply negated. In the implementation, the HD PowerBoost engine separates each frequency bin as belonging to one of the interleaved stations and apply the negated phase accumulator corresponding to the station.

It is important to note that the phase correction, while required, does not invalidate the orthogonality property of the OFDM signal. All carriers of each single station are orthogonal to the carriers in their neighboring stations.

$$\int_{sym\ start}^{sym\ end} carrierA(t)*carrierB(t)dt=0$$

In FIG. 1, the 3 exemplary stations were interleaved in an $A_L B_L C_L A_U B_U C_U$ pattern, where each individual station is assigned a letter. L and U subscripts identify the lower and upper sidebands respectively. A space without a sideband is marked by an underscore.

Figure 7:
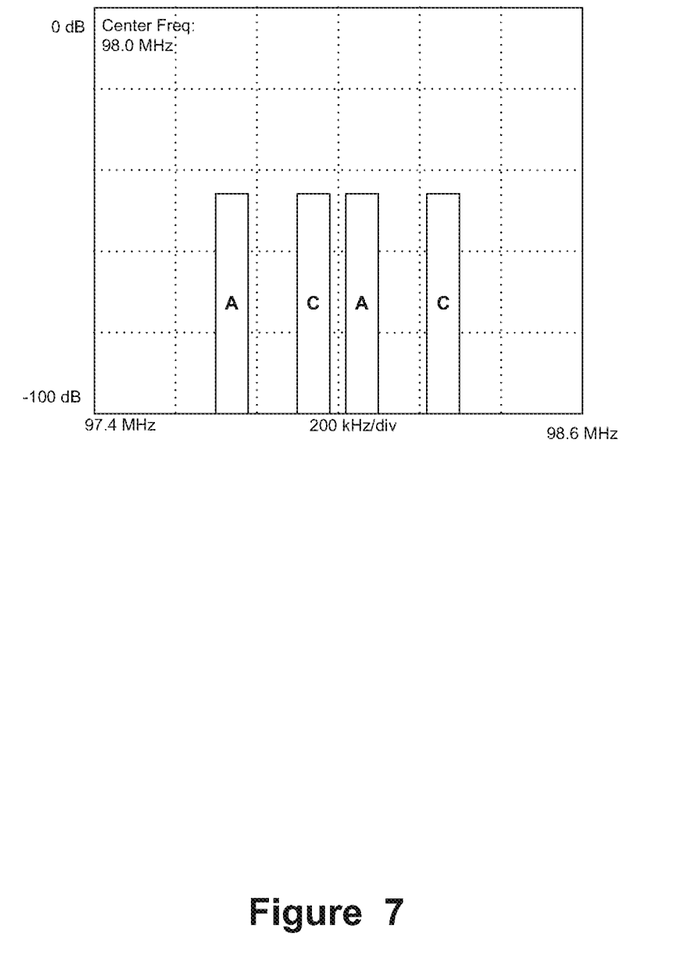
FIG. 7 depicts a dual station configuration.
Figure 8:
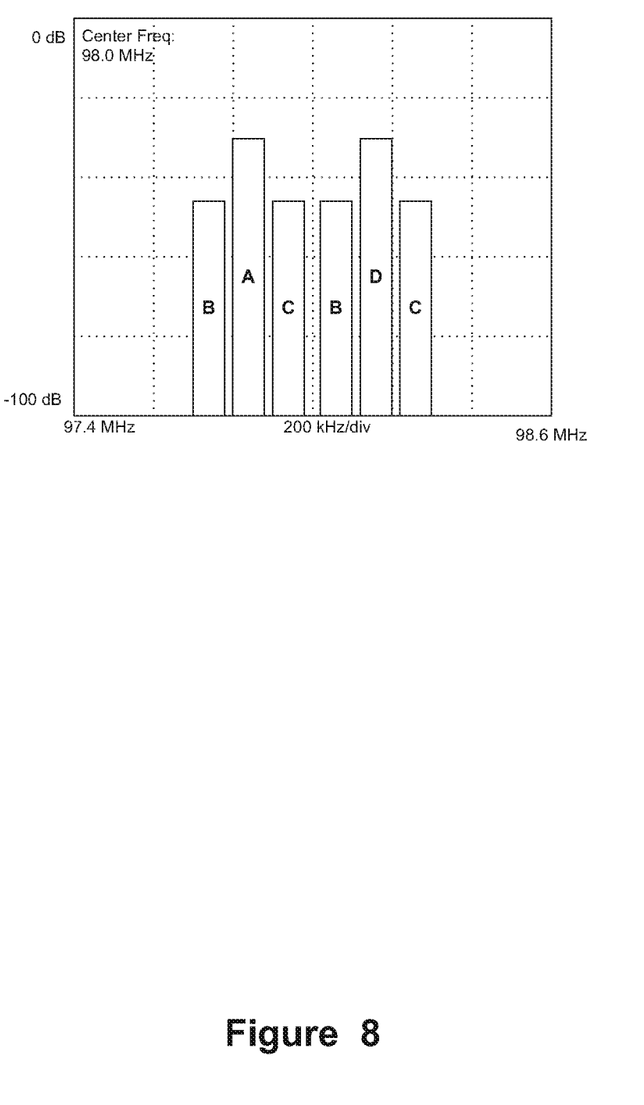
FIG. 8 depicts a 4 station configuration.
Figure 9:
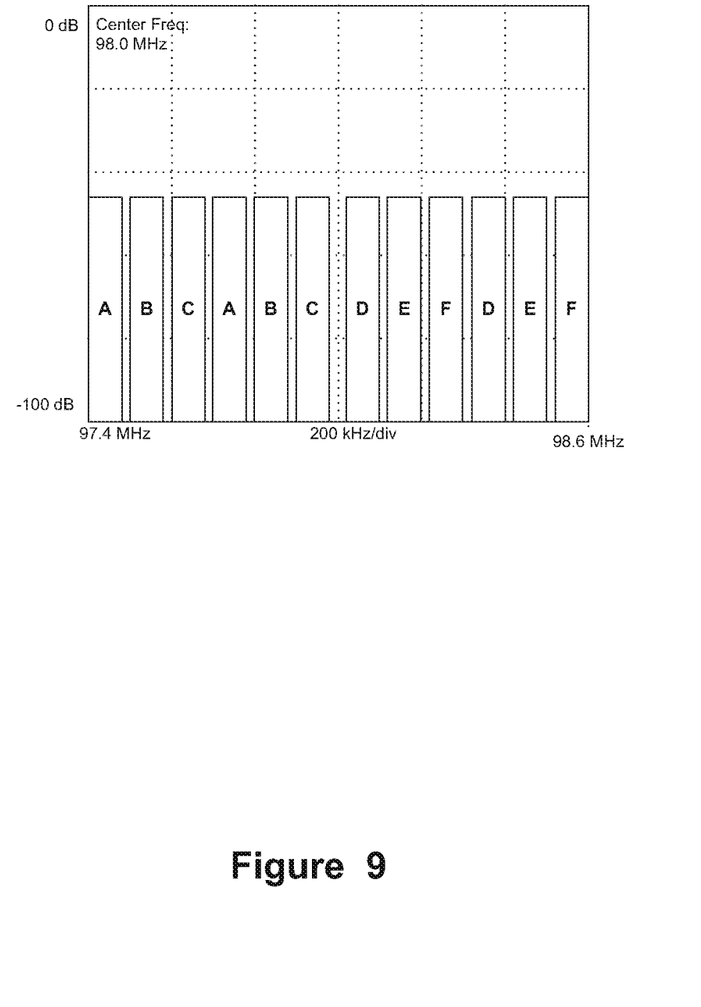
FIG. 9 depicts a 6 station configuration.
Figure 10:
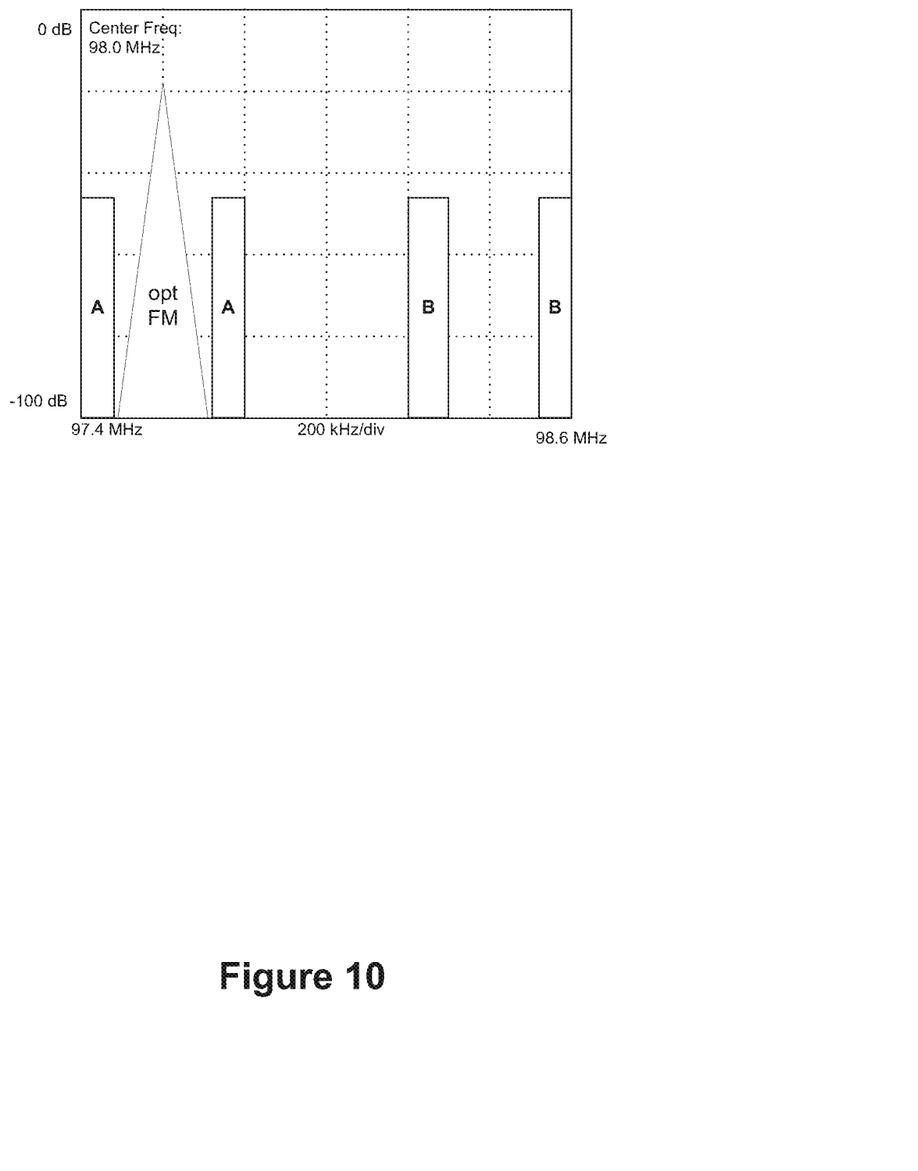
FIG. 10 depicts a multiplex having an FM channel.
Figure 11:
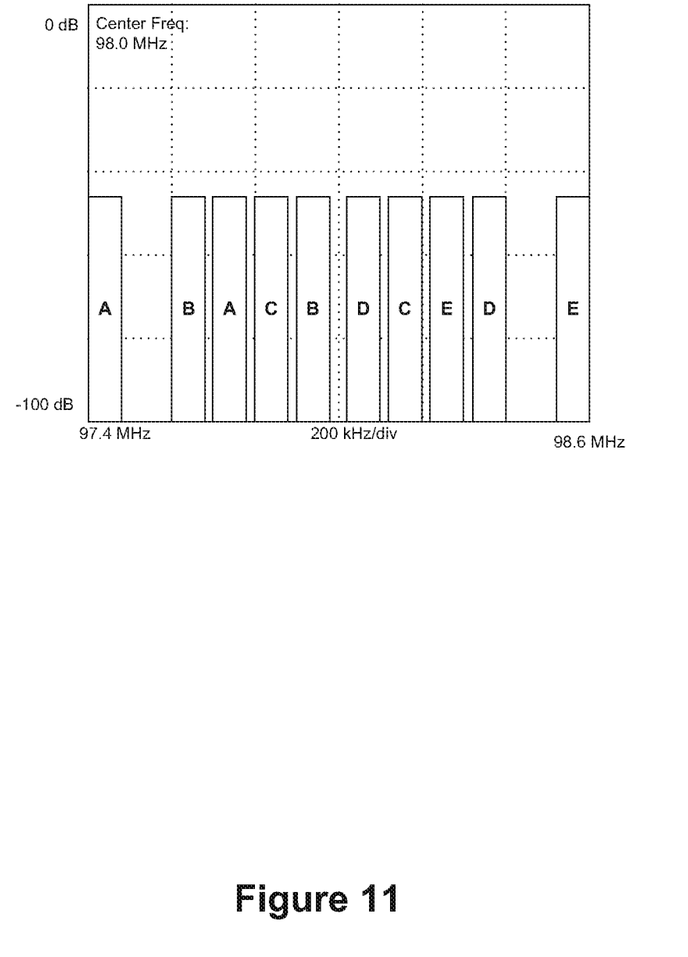
FIG. 11 depicts a typical channel interleaving pattern.
Figure 13:
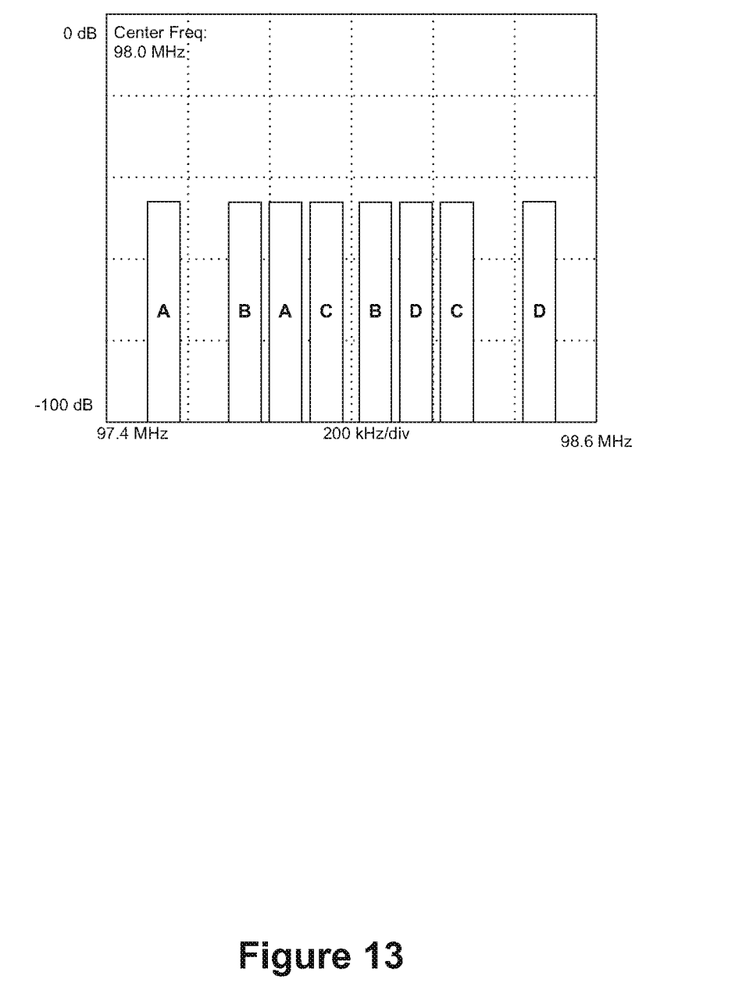
FIG. 13 depicts a 4 station configuration over 1 MHz.

Interleaving IBOC signals has been discussed in the context of IBOC frequency planning for all-digital IBOC transmission, having the interleaved multiplex emitted from a single transmitter is novel. For frequency planning, the interleaving pattern typically is $A_L\_B_L A_U C_L B_U D_L C_U E_L D_U\_E_U$, as depicted in FIG. 11, creating a continuous chain of individual stations across the FM band. A new interleaving pattern of ABCABC may be used to create a packed 600 kHz signal in order to be able to pass it through a standard exciter up-conversion chain. A 1 MHz signal variant could be created as $A_L\_B_L A_U C_L B_U D_L C_U\_D_U$, as depicted in FIG. 13, a 1.2 MHz variant can be $A_L B_L C_L A_U B_U C_U D_L E_L F_L D_U E_U F_U$, as depicted in FIG. 9. Further combinations are possible when considering single sideband stations as part of the multiplex. For example, the 1 MHz solution can be reduced to 600 kHz by turning off the outer sidebands ($B_L A_U C_L B_U D_L C_U$, as depicted in FIG. 8). This provides a solution with 4 stations at 200 kHz channel spacing. FIGS. 1 and 4-11 and 13 show spectra representing just a few of the possible signal configurations.

Further station interleaving combinations using more and more bandwidth are possible; however, at some point becomes impractical in a typical broadcast transmitter with more demanding baseband envelopes and diminishing resolution per station.

The system described herein uses a single transmitter to broadcast 2 or more independent IBOC signals (or other digital signal types). For example, 3 stations interleaved as $A_L B_L C_L A_U B_U C_U$, depicted in FIG. 1. Further, 2 stations may be interleaved as $A_L\_C_L A_U\_C_U$, depicted in FIG. 7 The system may provide reduced bandwidth modes using single sidebands, such as $B_L C_L A_L B_U$, depicted in FIG. 5, or $C_L A_L$. The sideband levels may be adjustable (including sideband off—single sideband). The IBOC service modes are independently configurable such as MP1,2,3 for hybrid and MP5,6 for all digital. Future modes will likely work, including new single sideband modes.

The system described herein provides peak reduction, pre-correction, amplification and transmission of the interleaved multiplex, which may be provided based on the peak reduction described in HD PowerBoost or similar algorithms for example algorithms based on the patent family of Kroeger and Shastri (WO2001015402 A1 and derivatives). Other methods, such as clip and filter may be used. With the system described herein, PAPR stays about constant with addition of carriers. The transmitted signal provides a receiver the appearance of three independent stations from a single OFDM modulator. The system corrects the symbol-to-symbol phase rotation resulting from the frequency shift in order to be able to correct the constellation of carriers within the multiplex. The system may utilize independent, yet synchronized orthogonal modulators that have synchronized symbol timing, perfect frequency and standard carrier spacing. Utilizing the frequency spectrum of an oversampled IBOC signal may further extend the multiplex interleaved pattern, for example a 1 MHz solution may be interleaved as $A_L\_B_L A_U C_L B_U D_L C_U\_D_U$, as depicted in FIG. 13, while a 1.2 MHz solution may be interleaved as $A_L B_L C_L A_U B_U C_U D_L E_L F_L D_U E_U F_U$, as shown in FIG. 9. Other interleave patterns may be provided. The independent signals may be added via frequency shift and addition only, without the use of FFTs. The system may provide SFN implementations of all or just part of the IBOC multiplex.

Although the above describes the system with regard to multiplexing IBOC stations, the system may be applied to other OFDM signal types such as DRM+, or China Digital Radio.

The system may include optional FM carriers to allow receivers to scan for the station. The phase of multiple FM carriers may be controlled to avoid excessive peaks through FM carrier addition. Narrow band FM modulation may be used to provide a stream instructing the analog FM listener to tune in via a digital radio. A standard FM signal may be maintained as part of the larger multiplex. For example, a pattern of $A_U B_L FFB_U C_L$, where the F denotes the standard FM signal, can be created providing more IBOC bandwidth to a standard hybrid FM+IBOC station as used with HD PowerBoost. Channel combining of conventional hybrid FM+IBOC stations is an application for maintaining the FM carrier in conjunction with this concept. Multiple frequency shifted IBOC signals and peak reduced with the described method can be broadcast via a single transmitter and antenna system. The corresponding FM carriers of the stations can be broadcast using a channel combiner on one antenna. Using the HD PowerBoost concepts allows one FM carrier to be maintained as part of the larger multiplex, as shown in FIG. 10. Having multiple FM carriers in the multiplex is possible, but not practical as the FM carriers will beat with one-another and create excessive peaks. It can be appreciated that the FM signal, treated as per reference only, can be substituted with any unrelated signal type that is to be maintained. Just like HD PowerBoost clipping noise can be treated differently on the FM signal, that is maintained as is, and the IBOC signal that is operated on.

It may be possible to synchronize multiple exciters together to allow the multiplex of the stations to be spread across multiple transmitters. An electronic program guide, channel lists and alternate frequency information may be provided to a receiver tuned into a single (IBOC) signal in order to provide the receiver with information about the other stations on the same multiplex. The receiver may no longer need to scan for the other stations on the multiplex to be discovered.

Independent single station modulator components (e.g. exgine, importer, exporter) can be implemented on a single or on multiple hardware platforms, such as CPUs, FPGAs, or similar.

A receiver with a 600 kHz+ bandwidth may simultaneously receive all streams and "channel bond" the data, which may provide various applications including personal radio and/or providing conditional access to some audio/data services or just the enhanced audio. The receiver may use 2 or more existing IBOC demodulators.

Figure 4:
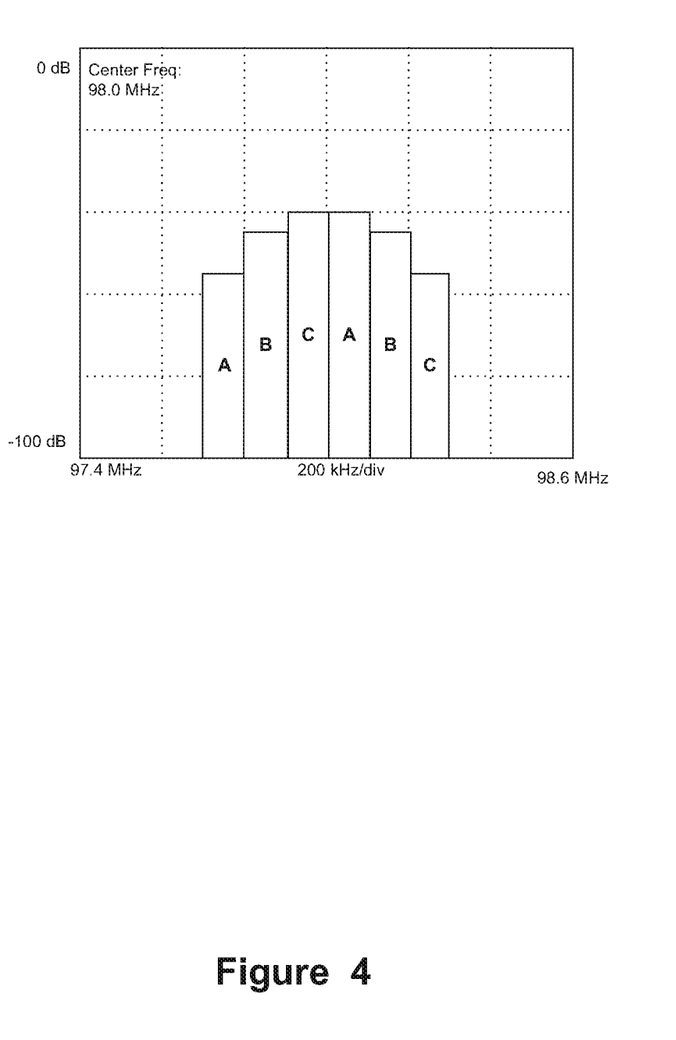
FIG. 4 depicts 3 interleaved stations.
Figure 5:
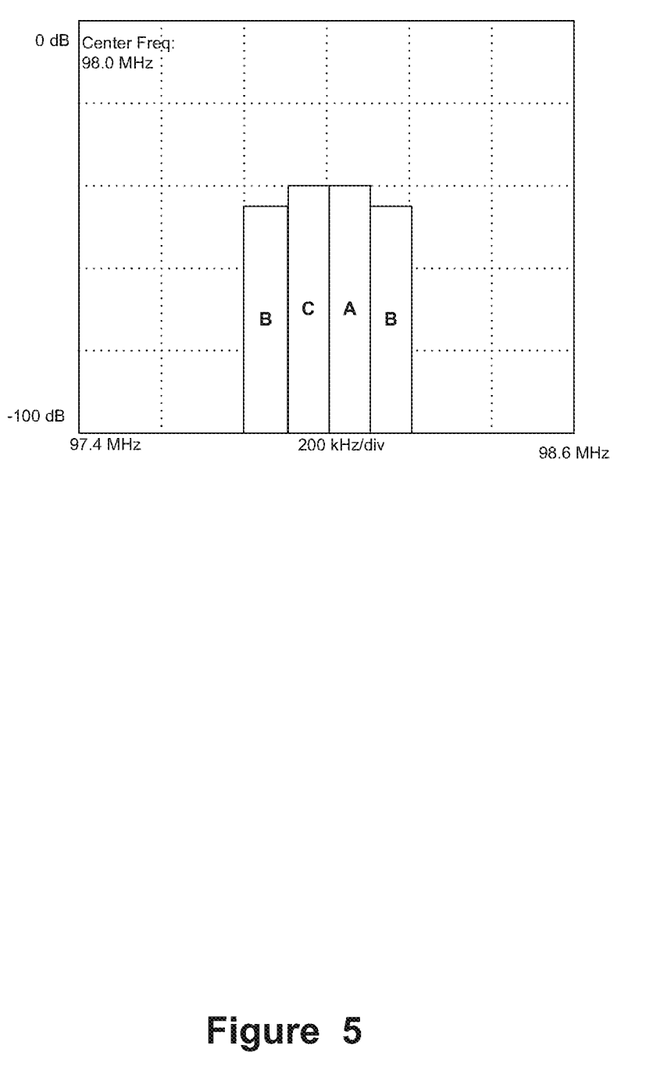
FIG. 5 depicts a 400 kHz mode.

FIG. 4 depicts 3 interleaved stations. FIG. 5 depicts a 400 kHz mode composed of one station using dual sidebands and 2 stations using single sideband modes. A 200 kHz mode is also possible by turning off the outer sets of carriers leaving only two stations each using a single sideband that could either be an upper or lower sideband. FIG. 6 depicts an unmodulated FM Carrier with three sets of IBOC signals. An unmodulated carrier can be used to allow receivers to scan for the station. Up to 90% of the broadcast power is allocated to the FM carrier. Each single station can maintain its own carrier. The beating of the 3 carriers and the resulting signal peaks can be addressed in the crest factor reduction engine by cancelling with the IBOC carriers. Wide deployment of improved HD scan capability is seen as a possible solution to the scanning problem of having the interleaved stations. It may not be desirable to have analog receivers tune in to this all digital signal, so it may be desirable to turn off the FM carrier in the first place. If the carrier is present, it may be possible to add very low level modulation instructing the listener of an analog radio to tune in using an HD radio receiver. FIG. 7 depicts a dual station configuration. FIG. 1 depicts a 3 station configuration. Four stations are possible if the center ones are single sideband as shown in FIG. 8.

The hardware, software, firmware and combinations thereof providing the above described functionality may reside in the same physical systems, or may be distributed in multiple devices and/or systems.

Although specific embodiments are described herein, it will be appreciated that modifications may be made to the embodiments without departing from the scope of the current teachings. Accordingly, the scope of the appended claims should not be limited by the specific embodiments set forth, but should be given the broadest interpretation consistent with the teachings of the description as a whole.

What is claimed is:

1. A digital radio receiver configured to:
   receive and demodulate a radio frequency signal at a receiver antenna, wherein the radio frequency signal comprises a combined multiplex signal having a plurality of different station signals each with symbols that are time aligned to each other;
   track symbols using a single symbol tracking loop that applies equally to all stations in the combined multiplex signal;
   apply a wide bandwidth Fast Fourier Transform (FFT) to the combined multiplex signal;
   correct a symbol-to-symbol rotating phase offset before applying a frequency domain correction; and
   produce an output signal for further station data decoding.

2. The digital radio receiver of claim 1, wherein at least a portion of an available data capacity of at least some station signals in the multiplex signal are aggregated.

3. The digital radio receiver of claim 1, wherein a single receiver demodulator is used in decoding data of at least some station signals in the multiplex signal.

4. The digital radio receiver of claim 1, wherein the receiver is
   an HD Radio® receiver,
   a Digital Radio Mondiale (DRM) receiver, or
   a China Digital Radio receiver.

5. The digital radio receiver of claim 1, where the output signal is used for channel estimation.

6. The digital radio receiver of claim 1, where the output signal is error corrected.

* * * * *